United States Patent
Kwack et al.

(10) Patent No.: US 6,859,412 B1
(45) Date of Patent: Feb. 22, 2005

(54) CIRCUIT FOR CONTROLLING DRIVER STRENGTHS OF DATA AND DATA STROBE IN SEMICONDUCTOR DEVICE

(75) Inventors: Seung Wook Kwack, Daejeon-si (KR); Kwan Weon Kim, Icheon-si (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/744,993

(22) Filed: Dec. 23, 2003

(30) Foreign Application Priority Data

Nov. 13, 2003 (KR) .............................. 10-2003-0080048

(51) Int. Cl.[7] .................................................. G11C 7/10
(52) U.S. Cl. .................. 365/230.06; 365/193; 365/194; 365/189.05; 365/201; 326/27; 326/83; 326/106
(58) Field of Search ................................ 365/193, 194, 365/191, 230.06, 189.05, 201; 326/26, 27, 82, 83, 106, 108

(56) References Cited

U.S. PATENT DOCUMENTS

| | | | | |
|---|---|---|---|---|
| 4,476,548 A | * | 10/1984 | Matsumoto et al. | ........ 365/204 |
| 4,495,626 A | * | 1/1985 | Brunin et al. | ................ 375/292 |
| 6,111,446 A | * | 8/2000 | Keeth | .......................... 327/258 |
| 6,316,979 B1 | * | 11/2001 | Keeth | .......................... 327/258 |
| 6,625,067 B2 | * | 9/2003 | Yi | .......................... 365/189.05 |

* cited by examiner

*Primary Examiner*—Andrew Q. Tran
(74) *Attorney, Agent, or Firm*—Marshall, Gerstein & Borun LLP

(57) ABSTRACT

A circuit for controlling driver strengths of a data and a data strobe in a semiconductor device comprising: a control signal generating unit which generates a first control signal in response to a first address code, generates a second control signal in response to a second address code, and generates a third control signal in response to a third address code; a data driver strength control unit which is selected in response to the first control signal, controls a driver strength of an input data in response to the second control signal, and finely adjusts the driver strength of the input data in response to the third control signal; and a data strobe driver strength control unit which is selected in response to the first control signal, controls a driver strength of an input data strobe in response to the second control signal, and finely adjusts the driver strength of the input data strobe in response to the third control signal.

12 Claims, 4 Drawing Sheets

CIRCUIT FOR CONTROLLING DRIVER STRENGTHS OF DATA AND DATA STROBE IN SEMICONDUCTOR DEVICE

BACKGROUND

1. Field of the Invention

The present invention relates to a data transmission of a semiconductor device for a high-speed operation and, more specifically, to a circuit for controlling driver strengths of a data and a data strobe in a semiconductor device capable of separately controlling strengths of a data driver and a data strobe driver to adjust a setup and hold time of a system.

2. Discussion of Related Art

With great requirement for a high-speed memory, the minimum data determining time of a data setup/hold time, which was not important in a low-speed memory, tends to be decreased into several hundreds ps unit. This condition gives a large difficulty to determination of data in the high-speed memory. In fact, a DRAM drives data (DQ) and data strobe (DQS) with the same strength, and the DQS is used as a reference signal for receiving the data in a system, which receives the data from the DRAM.

After constructing a system, a data setup/hold time required for the system exists. It is very difficult to change the setup/hold time set once in that system.

In general, in a low-speed memory, a sufficient data transmission is possible with the setup/hold time set once, but in a high-speed memory, problems may be caused. Therefore, in a high-speed memory, it may be required that the setup/hold time is re-adjusted.

If problems occur in a previously set system, strengths of data and data strobe thereof are simultaneously controlled. This conventional art will be described with reference to FIGS. 1 and 2.

In response to input of an extended mode register set (EMRS) code A1 and A2, a control signal is outputted from an EMRS circuit 10. In accordance with this control signal, a driver strength control signal is generated from a driver strength control unit 20. A DQS driver 30 and a DQ driver 40 are simultaneously controlled by means of the driver strength control signal. As a result, DQS and DQ, of which strengths are controlled, are outputted, respectively.

FIG. 2 is a detailed block diagram of the driver strength control unit 20.

For example, output signals of the driver strength control unit 20 are classified into three kinds of signals, that is, a weak signal, a half signal and a full signal.

Since the strength of the DQS driver is not controlled or is controlled together with the strength of the DQ driver, a circuit for controlling the strength of the DQS driver is omitted in FIG. 2.

A data strength control unit comprises a plurality of delay units 310 to 380.

When a weak signal is outputted from the EMRS circuit 10, the data DQ is inputted to the DQ driver 40 only via first to third delay units 310 to 330.

When a half signal is outputted from the EMRS circuit 10, the data DQ is inputted to the DQ driver 40 only via first to sixth delay units 310 to 360.

When a full signal is outputted from the EMRS circuit 10, the data DQ is inputted to the DQ driver 40 via first to eighth delay units 310 to 380.

Conventionally, as described above, the strengths of the DQS driver and the DQ driver could not help being controlled at the same time. That is, since the strengths of the DQS driver and the DQ driver are controlled at the same time and in the same way, arriving times of the DQ and the DQS which is a reference for receiving the data in a party receiving the data could not be adjusted separately. For this reason, the setup/hold time could not be finely controlled in the previously set system.

SUMMARY OF THE INVENTION

In order to solve the above problems, the present invention is directed to a circuit for controlling driver strengths of a data and a data strobe capable of separately controlling and finely adjusting driver strengths of a DQ and a DQS.

In order to achieve the above object, the present invention provides a circuit for controlling driver strengths of a data and a data strobe in a semiconductor device, the circuit comprising: a control signal generating unit which generates a first control signal in response to a first address code, generates a second control signal in response to a second address code, and generates a third control signal in response to a third address code; a data driver strength control unit which is selected in response to the first control signal, controls a driver strength of an input data in response to the second control signal, and finely adjusts the driver strength of the input data in response to the third control signal; and a data strobe driver strength control unit which is selected in response to the first control signal, controls a driver strength of an input data strobe in response to the second control signal, and finely adjusts the driver strength of the input data strobe in response to the third control signal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Now, the present invention will be described in detail with reference to the accompanying drawings.

Figure 1:
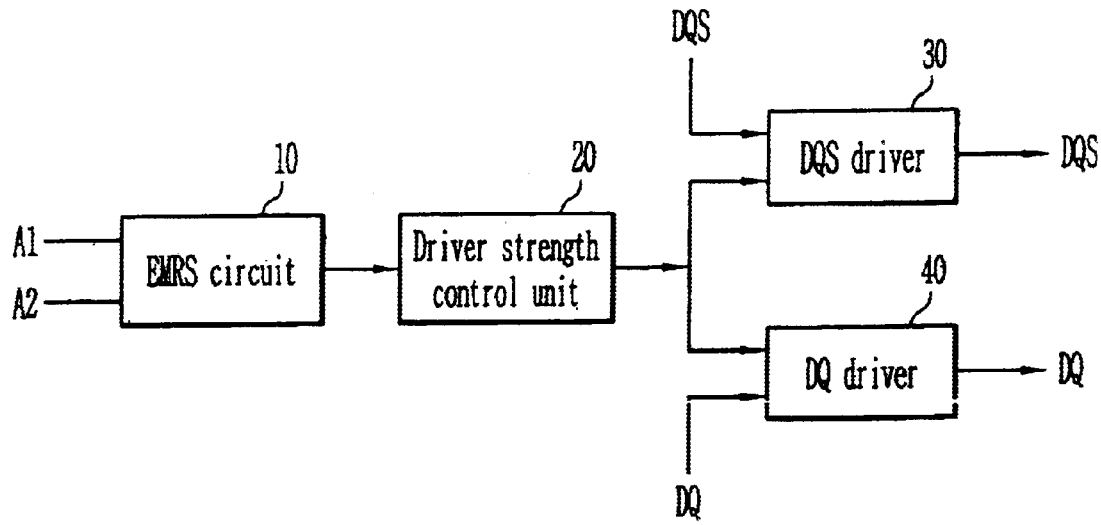
FIG. 1 is a block diagram illustrating conventional strength control of a data driver and a data strobe driver.
Figure 2:
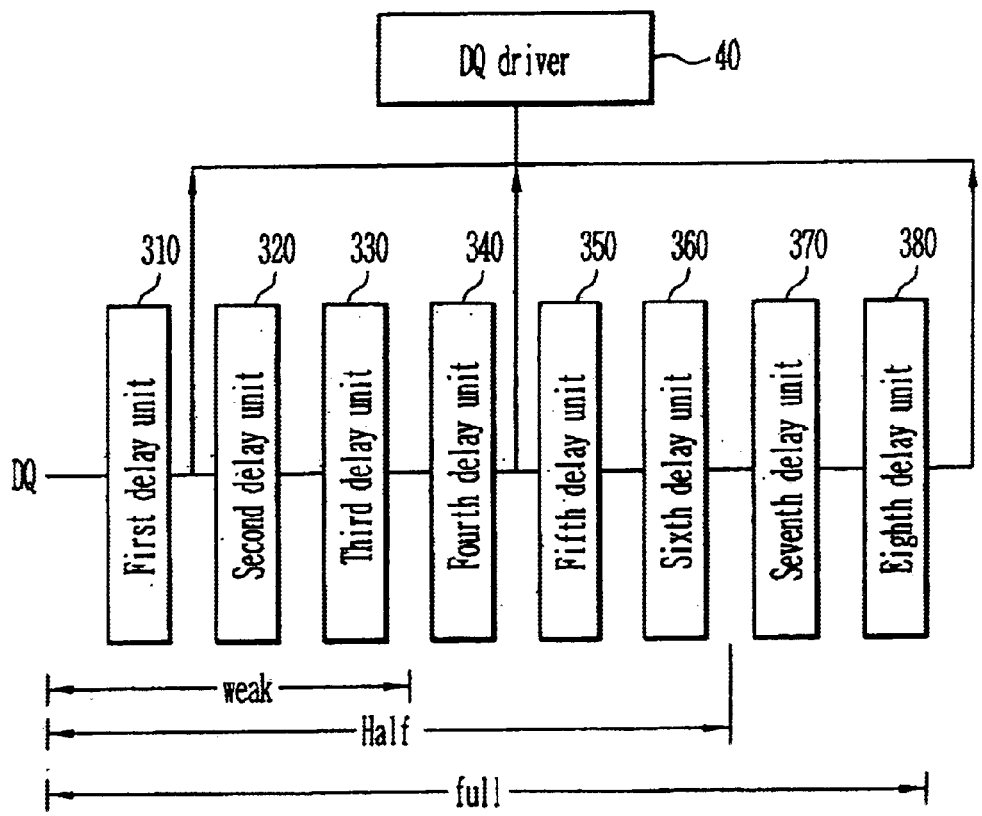
FIG. 2 is a detailed block diagram illustrating a driver strength control unit of FIG. 1.
Figure 3:
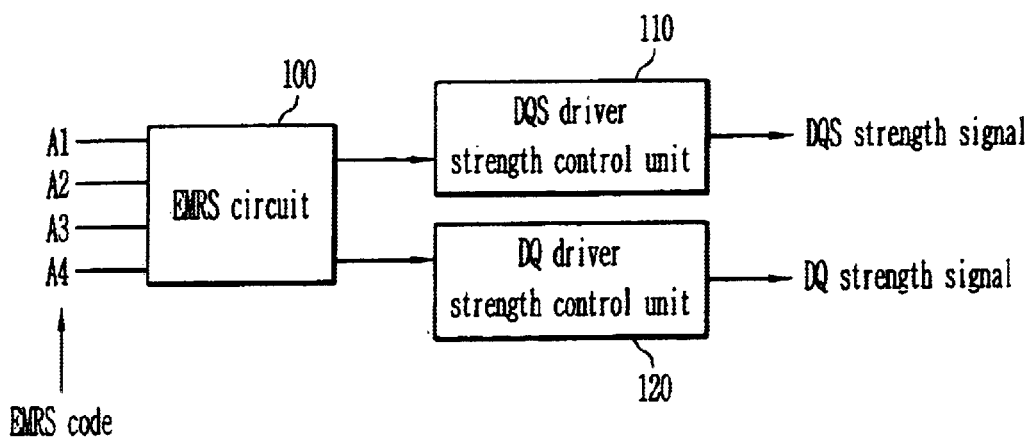
FIG. 3 is a block diagram illustrating strength control of a data driver and a data strobe driver according to a first embodiment of the present invention.

FIG. 3 is a block diagram illustrating strength control of a data driver and a data strobe driver according to a first embodiment of the present invention.

EMRS address codes A1, A2 are address codes for determining which strength method should be used. That is, in accordance with the EMRS codes, the extended mode register set (EMRS) circuit 100 generates a weak signal, a half signal and a full signal. An address code A3 is used for selectively driving a DQS driver strength control unit 10 and a DQ driver strength control unit 120. An address code A4 is used for classifying driver strengths of the DQS and DQ into up operation and down operation to control them.

For example, when the address code A3 is in a high state, the DQS driver strength control unit 110 is selected, and when the address code A3 is in a low state, the DQ driver strength control unit 120 is selected. When the address code A4 is in a low state, the driver strengths of the DQ and the DQS are adjusted small by means of a down switching operation, and when the address code A4 is in a high state, the driver strengths of the DQ and the DQS are adjusted largely by means of an up switching operation.

Figure 4:
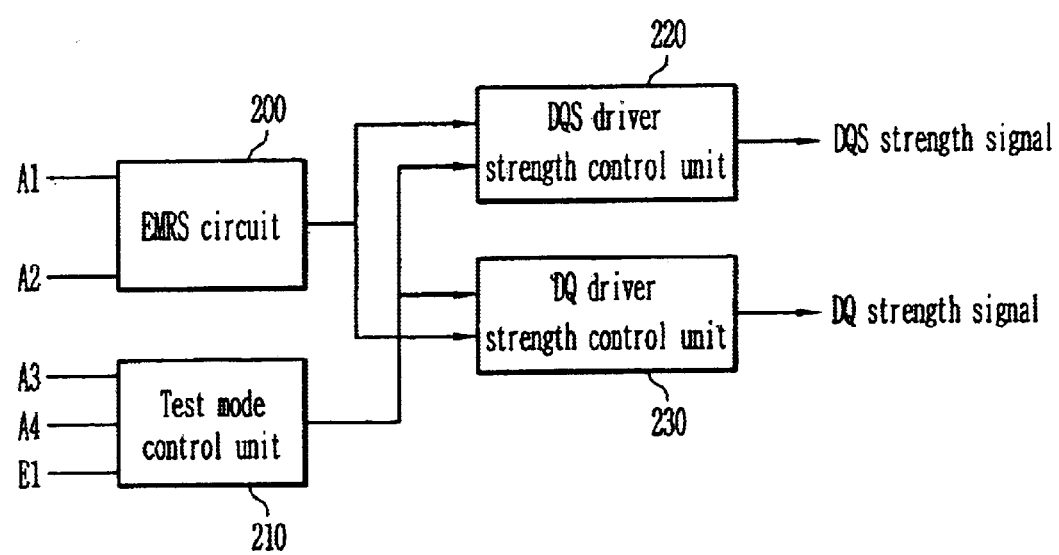
FIG. 4 is a block diagram illustrating strength control of a data driver and a data strobe driver according to a second embodiment of the present invention.

FIG. 4 is a block diagram illustrating a strength control of the data driver and the data strobe driver according to a second embodiment of the present invention.

The address codes A1 and A2 are inputted to the EMRS circuit 200, and the address codes A3 and A4 are inputted to a test mode control unit 210.

Since all the operations except for the test mode operations are equal to those of FIG. 3, only the test mode operation will be described.

In a test mode operation, when a test mode is activated due to a test mode enable signal E1, the DQ and the DQS are supplied to the DQS driver and the DQ driver without adjustment of driver strengths of the DQ and the DQS, so that the DQS driver and the DQ driver are driven at the same timing and slope.

After the test mode, the DQS driver strength control unit 220 and the DQ driver strength control unit 230 are selectively driven in accordance with the address codes A1, A2, A3 and A4, so that the driver strength of the input DQS or DQ is controlled.

Figure 5:
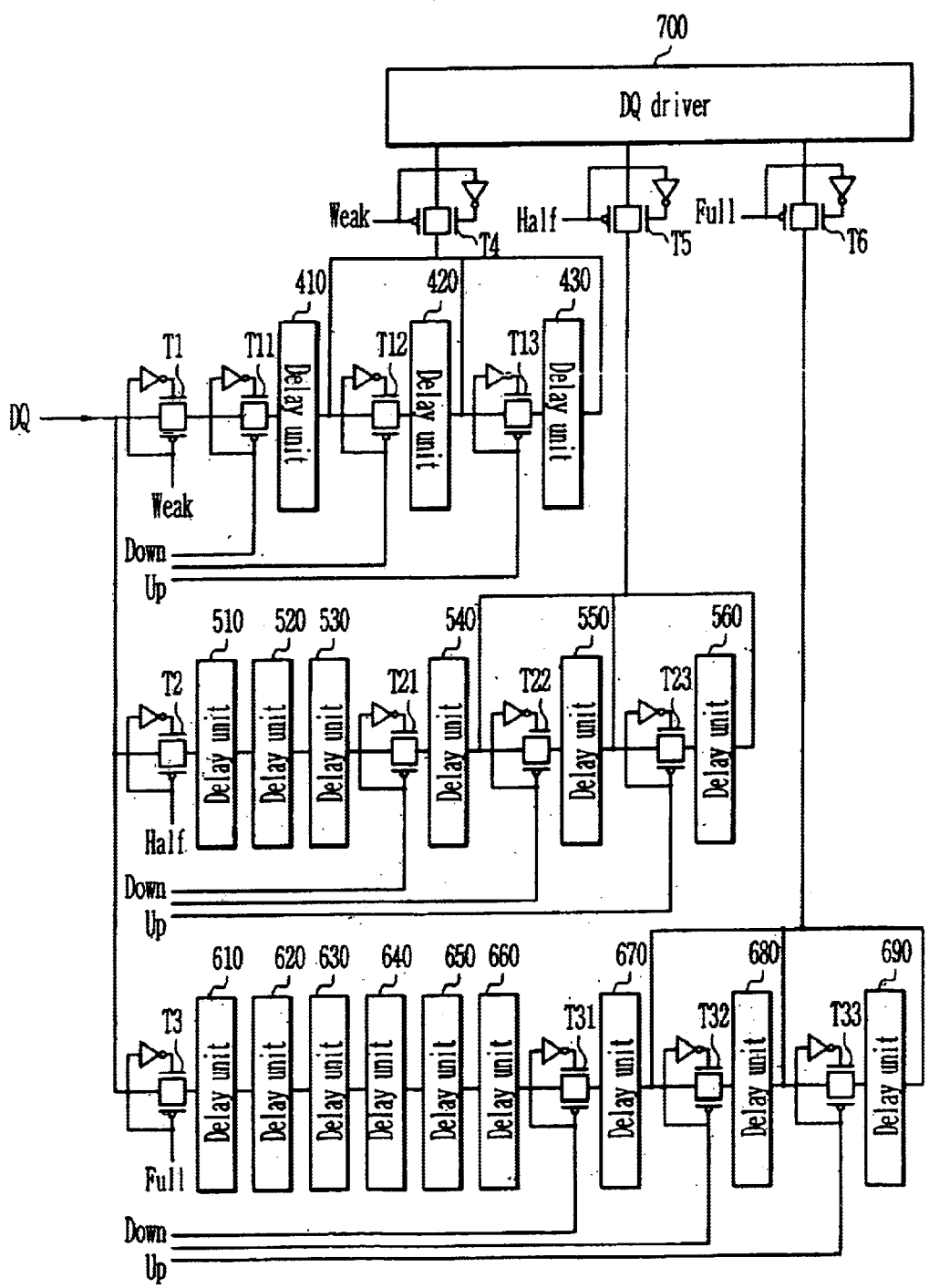
FIG. 5 is a detailed circuit diagram illustrating a DQ driver strength control unit of FIGS. 3 and 4.

FIG. 5 is a detailed circuit diagram of the DQ driver strength control unit of FIGS. 3 and 4.

The DQ driver and the DQS driver have the same structure, and the DQ driver strength control unit and the DQS driver strength control unit have also the same structure.

For example, when a weak signal is outputted from the EMRS circuit 100 or 200, pass gates T1, T11, T12 and T4 are turned on. As a result, the data (DQ) is inputted to the DQ driver 700 via delay units 410 and 420.

At that time, when the address code A4 is in a low state, pass gate T12 which has been turned on due to the output signal from the EMRS circuit 200 corresponding thereto is turned off, so that the data (DQ) is inputted to the DQ driver 700 only via the delay unit 410.

When the address code A4 is in a high state, pass gates T11, T12 and T13 are turned on due to the output signal from the EMRS circuit 200 corresponding thereto, so that the data (DQ) is inputted to the DQ driver 700 via the delay units 410 to 430.

For example, when a half signal is outputted from the EMRS circuit 100 or 200, pass gates T2, T21, T22 and T5 are turned on. As a result, the data (DQ) is inputted to the DQ driver 700 via the delay units 510 to 550.

At that time, when the address code A4 is in a low state, the pass gate T22 which has been turned on due to the output signal from the EMRS circuit 200 corresponding thereto is turned off, so that the data (DQ) is inputted to the DQ driver 700 only via the delay units 510 to 540.

When the address code A4 is in a high state, the pass gates T21, T22 and T23 are turned on due to the output signal from the EMRS circuit 200 corresponding thereto, so that the data (DQ) is inputted to the DQ driver 700 via the delay units 510 to 560.

For example, when a full signal is outputted from the EMRS circuit 100 or 200, pass gates T3, T31, T32 and T6 are turned on. As a result, the data (DQ) is inputted to the DQ driver 700 via the delay units 610 to 680.

At that time, when the address code A4 is in a low state, the pass gate T32 which has been turned on due to the output signal from the EMRS circuit 200 corresponding thereto is turned off, so that the data (DQ) is inputted to the DQ driver 700 only via the delay units 610 to 670.

When the address code A4 is in a high state, the pass gates T31, T32 and T33 are turned on due to the output signal from the EMRS circuit 200 corresponding thereto, so that the data (DQ) is inputted to the DQ driver 700 via the delay units 610 to 690.

Figure 6:
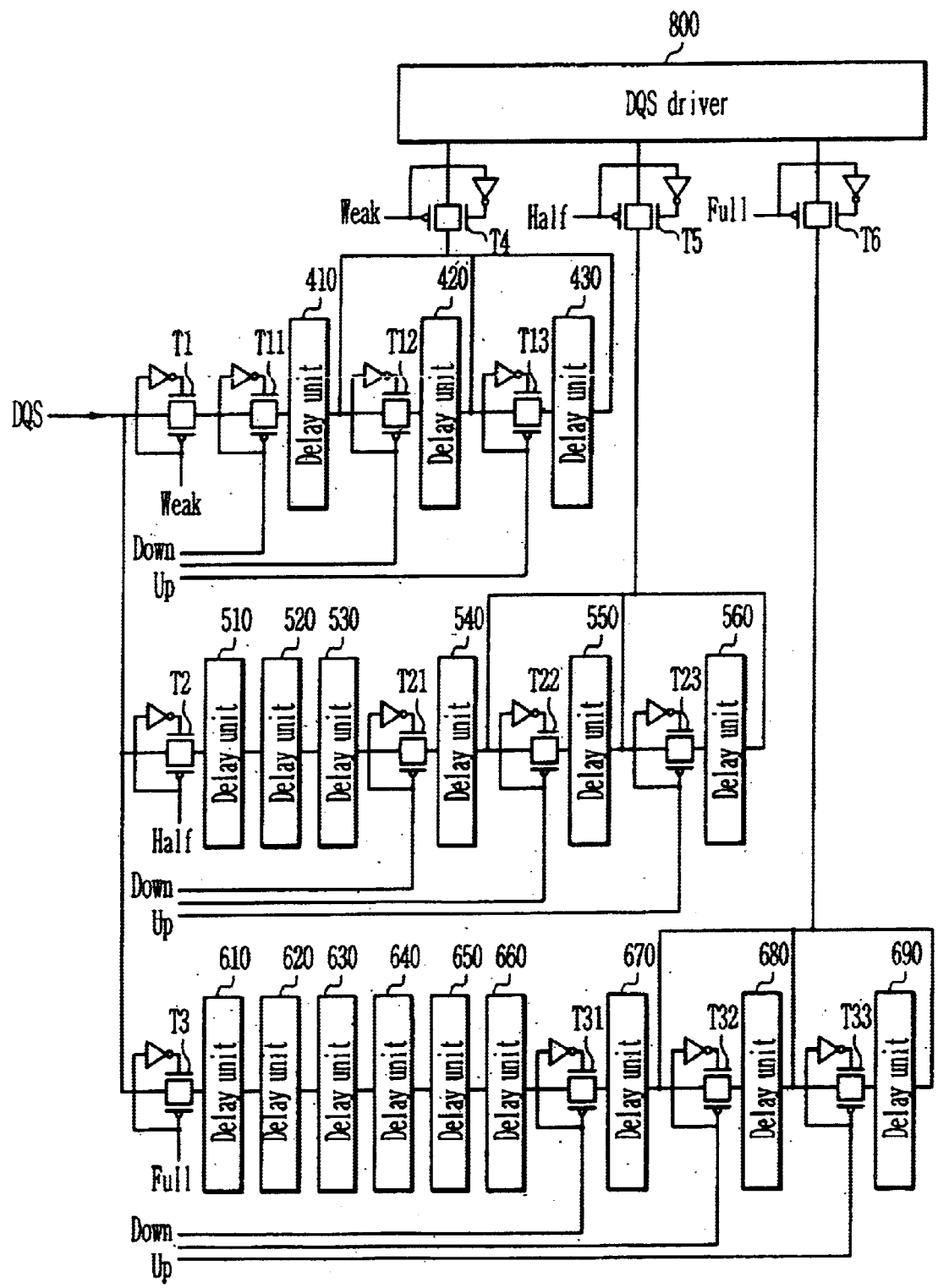
FIG. 6 is a detailed circuit diagram illustrating a DQS driver strength control unit of FIGS. 3 and 4.

FIG. 6 is a detailed circuit diagram of the DQS driver strength control unit of FIGS. 3 and 4.

For example, when a weak signal is outputted from the EMRS circuit 100 or 200, the pass gates T1, T11, T12 and T4 are turned on. As a result, the data (DQ) is input to the DQS driver 800 via the delay units 410 and 420.

At that time, when the address code A4 is in a low state, the pass gate T12 which has been turned on due to the output signal from the EMRS circuit 200 corresponding thereto is turned off, so that the data strobe (DQS) is inputted to the DQS driver 800 only via the delay unit 410.

When the address code A4 is in a high state, the pass gates T11, T12 and T13 are turned on due to the output signal from the EMRS circuit 200 corresponding thereto, so that the data strobe (DQS) is inputted to the DQS driver 800 via the delay units 410 to 430.

For example, when a half signal is outputted from the EMRS circuit 100 or 200, the pass gates T2, T21, T22 and T5 are turned on. As a result, the data strobe (DQS) is inputted to the DQS driver 800 via the delay units 510 to 550.

At that time, when the address code A4 is in a low state, the pass gate T22 which has been turned on due to the output signal from the EMRS circuit 200 corresponding thereto is turned off, so that the data strobe (DQS) is inputted to the DQS driver 800 only via the delay units 510 to 540.

When the address code A4 is in a high state, the pass gates T21, T22 and T23 are turned on due to the output signal from the EMRS circuit 200 corresponding thereto, so that the data strobe (DQS) is inputted to the DQS driver 800 via the delay units 510 to 560.

For example, when a full signal is outputted from the EMRS circuit 100 or 200, the pass gates T3, T31, T32 and T6 are turned on. As a result, the data strobe (DQS) is input to the DQS driver 800 via the delay units 610 to 680.

At that time, when the address code A4 is in a low state, the pass gate T32 which has been turned on due to the output signal from the EMRS circuit 200 corresponding thereto is turned off, so that the data strobe (DQS) is input to the DQS driver 800 only via the delay units 610 to 670.

When the address code A4 is in a high state, the pass gates T31, T32 and T33 are turned on due to the output signal from the EMRS circuit 200 corresponding thereto, so that the data strobe (DQS) is input to the DQS driver 800 via the delay units 610 to 690.

Although the EMRS circuit has been described as an example in the above embodiments of the present invention, a mode register set (MRS) circuit may be used.

As described above, the present invention is available in both of a high-speed dram and a low-speed dram, and it is possible to efficiently adjust the setup/hold time of a system, by adjusting the DQ and DQS driver strengths in combination of the MRS, EMRS or other codes.

In addition, according to the present invention, it is possible to separately control and finely control the DQ and DQS driver strengths.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A circuit for controlling driver strengths of a data and a data strobe in a semiconductor device, comprising:

a control signal generating unit which generates a first control signal in response to a first address code, generates a second control signal in response to a second address code, and generates a third control signal in response to a third address code;

a data driver strength control unit which is selected in response to the first control signal, controls a driver strength of an input data in response to the second control signal, and finely adjusts the driver strength of the input data in response to the third control signal; and a data strobe driver strength control unit which is selected in response to the first control signal, controls a driver strength of an input data strobe in response to the second control signal, and finely adjusts the driver strength of the input data strobe in response to the third control signal.

2. The circuit for controlling driver strengths of a data and a data strobe in a semiconductor device according to claim 1, wherein the control signal generating unit includes an extended mode register set (EMRS) circuit or a mode register set (MRS) circuit.

3. The circuit for controlling driver strengths of a data and a data strobe in a semiconductor device according to claim 1, wherein the second control signal has three states.

4. The circuit for controlling driver strengths of a data and a data strobe in a semiconductor device according to claim 1, wherein the third control signal has two states.

5. The circuit for controlling driver strengths of a data and a data strobe in a semiconductor device according to claim 1, wherein the data driver strength control unit comprises:

a first pass gate which intermits transmission of the input data in response to a first state of the second control signal;

first, second and third delay units which are connected in series between the first pass gate and a first output terminal;

second, third and fourth pass gates which are provided between the first pass gate and the first delay unit, between the first delay unit and the second delay unit and between the second delay unit and the third delay unit, respectively, and are turned on in response to the third control signal;

a fifth pass gate which transmits the outputs of the first, second and third delay units to a DQ driver through the first output terminal in response to the first state of the second control signal;

a sixth pass gate which intermits transmission of the input data in response to a second state of the second control signal;

fourth, fifth, sixth, seventh, eighth and ninth delay units which are connected in series between the sixth pass gate and a second output terminal;

seventh, eighth and ninth pass gates which are provided between the sixth delay unit and the seventh delay unit, between the seventh delay unit and the eighth delay unit and between the eighth delay unit and the ninth delay unit, respectively, and are turned on in response to the third control signal;

a tenth pass gate which transmits the outputs of the seventh, eighth and ninth delay units to the DQ driver through the second output terminal in response to the second state of the second control signal;

an eleventh pass gate which intermits transmission of the input data in response to a third state of the second control signal;

tenth, eleventh, twelfth, thirteenth, fourteenth, fifteenth, sixteenth and seventeenth and eighteenth delay units which are connected in series between the eleventh pass gate and a third output terminal;

twelfth, thirteenth and fourteenth pass gates which are provided between the fifteenth delay unit and the sixteenth delay unit, between the sixteenth delay unit and the seventeenth delay unit and between the seventeenth delay unit and the eighteenth delay unit, respectively, and are turned on in response to the third control signal; and a fifteenth pass gate which transmits the outputs of the sixteenth seventeenth and eighteenth delay units to the DQ driver through the third output terminal in response to the second state of the third control signal.

6. The circuit for controlling driver strengths of a data and a data strobe in a semiconductor device according to claim 1, wherein the data driver strength control unit and the data strobe driver strength control unit have the same structure.

7. A circuit for controlling driver strengths of a data and a data strobe in a semiconductor device, comprising:

a test mode control unit which are enabled in response to a test enable signal, generates a first control signal in response to a first address code, and generates a third control signal in response to a third address code;

a control signal generating unit which generates a second control signal in response to a second address code;

a data driver strength control unit which is selected in response to the first control signal, controls a driver strength of an input data in response to the second control signal, and finely adjusts the driver strength of the input data in response to the third control signal; and a data strobe driver strength control unit which is selected in response to the first control signal, controls a driver strength of an input data strobe in response to the second control signal, and finely adjusts the driver strength of the input data strobe in response to the third control signal.

8. The circuit for controlling driver strengths of a data and a data strobe in a semiconductor device according to claim 7, wherein the control signal generating unit includes an extended mode register set (EMRS) circuit or a mode register set (MRS) circuit.

9. The circuit for controlling driver strengths of a data and a data strobe in a semiconductor device according to claim 7, wherein the second control signal has three states.

10. The circuit for controlling driver strengths of a data and a data strobe in a semiconductor device according to claim 7, wherein the third control signal has two states.

11. The circuit for controlling driver strengths of a data and a data strobe in a semiconductor device according to claim 7, wherein the data driver strength control unit comprises:

a first pass gate which intermits transmission of the input data in response to a first state of the second control signal;

first, second and third delay units which are connected in series between the first pass gate and a first output terminal;

second, third and fourth pass gates which are provided between the first pass gate and the first delay unit, between the first delay unit and the second delay unit and between the second delay unit and the third delay unit, respectively, and are turned on in response to the third control signal;

a fifth pass gate which transmits the outputs of the first, second and third delay units to a DQ driver through the first output terminal in response to the first state of the second control signal;

a sixth pass gate which intermits transmission of the input data in response to a second state of the second control signal;

fourth, fifth, sixth; seventh, eighth and ninth delay units which are connected in series between the sixth pass gate and a second output terminal;

seventh, eighth and ninth pass gates which are provided between the sixth delay unit and the seventh delay unit, between the seventh delay unit and the eighth delay unit and between the eighth delay unit and the ninth delay unit, respectively, and are turned on in response to the third control signal;

a tenth pass gate which transmits the outputs of the seventh, eighth and ninth delay units to the DQ driver through the second output terminal in response to the second state of the second control signal;

an eleventh pass gate which intermits transmission of the input data in response to a third state of the second control signal;

tenth, eleventh, twelfth, thirteenth, fourteenth, fifteenth, sixteenth and seventeenth and eighteenth delay units which are connected in series between the eleventh pass gate and a third output terminal;

twelfth, thirteenth and fourteenth pass gates which are provided between the fifteenth delay unit and the sixteenth delay unit, between the sixteenth delay unit and the seventeenth delay unit and between the seventeenth delay unit and the eighteenth, delay unit, respectively, and are turned on in response to the third control signal; and a pass gate which transmits the outputs of the fifteenth and sixteenth seventeenth, and eighteenth delay units to the DQ driver through the third output terminal in response to the second state of the third control signal.

12. The circuit for controlling driver strengths of a data and a data strobe in a semiconductor device according to claim 7, wherein the data driver strength control unit and the data drive strength control unit have the same structure.

* * * * *

UNITED STATES PATENT AND TRADEMARK OFFICE
CERTIFICATE OF CORRECTION

PATENT NO.    : 6,859,412 B1
DATED         : February 22, 2005
INVENTOR(S)   : Seung W. Kwack et al.

It is certified that error appears in the above-identified patent and that said Letters Patent is hereby corrected as shown below:

Column 6,
Line 15, please delete "sixteenth and seventeenth" and insert -- sixteenth, seventeenth --.
Line 26, please delete "sixteenth seventeenth" and insert -- sixteenth, seventeenth --.
Line 28, please delete "second state" and insert -- third state --.
Line 28, please delete "third control" and insert -- second control --.

Column 7,
Line 21, please delete "sixth;" and insert -- sixth, --.

Column 8,
Line 10, please delete "sixteenth and seventeenth" and insert -- sixteenth, seventeenth --.
Line 17, please delete "eighteenth," and insert -- eighteenth --.
Line 20, please delete "a pass" and insert -- a fifteenth pass --.
Lines 20-21, please delete "fifteenth and sixteenth seventeenth, and eighteenth" and insert -- sixteenth, seventeenth, and eighteenth --.
Line 23, please delete "second state" and insert -- third state --.
Line 23, please delete "third control" and insert -- second control --.
Line 27, please delete "data drive" and insert -- data strobe driver --.

Signed and Sealed this

Nineteenth Day of July, 2005

JON W. DUDAS
*Director of the United States Patent and Trademark Office*